United States Patent
Spahn

(10) Patent No.: US 7,589,325 B2
(45) Date of Patent: Sep. 15, 2009

(54) METHOD FOR RECORDING A DIGITAL X-RAY IMAGE, COUNTING X-RAY DETECTOR AND X-RAY SYSTEM

(75) Inventor: Martin Spahn, Chicago, IL (US)

(73) Assignee: Siemens Aktiengesellschaft, Munich (DE)

( * ) Notice: Subject to any disclaimer, the term of this patent is extended or adjusted under 35 U.S.C. 154(b) by 125 days.

(21) Appl. No.: 11/525,909

(22) Filed: Sep. 25, 2006

(65) Prior Publication Data

US 2007/0069143 A1 Mar. 29, 2007

(30) Foreign Application Priority Data

Sep. 26, 2005 (DE) .................. 10 2005 045 894

(51) Int. Cl.
*H01L 27/146* (2006.01)
*H05G 1/64* (2006.01)

(52) U.S. Cl. ................. 250/370.09; 378/98.8
(58) Field of Classification Search ............ 250/370.09, 250/395, 252.1, 370.08, 363.02, 369; 378/98.8, 378/19
See application file for complete search history.

(56) References Cited

U.S. PATENT DOCUMENTS 5,489,782 A * 2/1996 Wernikoff .................. 250/369

| 7,003,076 B2 * | 2/2006 | Okumura et al. .......... 378/98.8 |
| 2005/0098735 A1 | 5/2005 | Heismann |
| 2005/0105687 A1 | 5/2005 | Heismann et al. |
| 2005/0123090 A1 | 6/2005 | Heismann et al. |

FOREIGN PATENT DOCUMENTS

| DE | 101 09 002 A1 | 9/2002 |
| DE | 102 12 638 A1 | 10/2003 |
| DE | 103 57 187 A1 | 6/2005 |
| DE | 103 52 012 A1 | 6/2006 |

OTHER PUBLICATIONS

M. Spahn et. al. „Flachbilddetektoren in der Röntgendiagnostik, Radiologe 43, 2004, Seite 340-350.

* cited by examiner

*Primary Examiner*—David P Porta
*Assistant Examiner*—Faye Boosalis
(74) *Attorney, Agent, or Firm*—Harness Dickey and Pierce, P.L.C.

(57) ABSTRACT

In order to extend the field of application of counting x-ray detectors, a method is disclosed for recording a digital x-ray image and a counting x-ray detector. The counting x-ray detector includes pixel readout units arranged in the matrix being to detect and count x-ray quanta and/or charge pulses generated by x-ray quanta. Further, an item of temporal information is assigned to the charge pulses and/or the x-ray quanta as they are being counted.

17 Claims, 3 Drawing Sheets

METHOD FOR RECORDING A DIGITAL X-RAY IMAGE, COUNTING X-RAY DETECTOR AND X-RAY SYSTEM

PRIORITY STATEMENT

The present application hereby claims priority under 35 U.S.C. §119 on German patent application number DE 10 2005 045 894.7 filed Sep. 26, 2005, the entire contents of which is hereby incorporated herein by reference.

FIELD

The invention generally relates to a method for recording a digital x-ray image, a counting x-ray detector, and/or an x-ray system.

BACKGROUND

Image intensifier camera systems based on television cameras or CCD cameras, storage film systems with an integrated or external readout unit, systems with optical coupling of a converter film to CCD cameras or CMOS chips, selenium-based detectors with electrostatic readout, and x-ray detectors having active readout matrices with direct or indirect conversion of the x-radiation are examples of what is known in digital x-ray imaging.

Known in x-ray imaging for the purpose of recording digital x-ray images of an object are so called solid state detectors in the case of which an x-radiation is converted directly or indirectly into electric charge, and the electric charge is stored in so called active matrices that are assembled from a multiplicity of pixel readout units. The information is subsequently readout electronically and further processed for the purpose of image generation.

In the case of direct conversion, when impinging on a direct converter layer, for example made from amorphous selenium, an x-ray quantum of the x-radiation produces a high energy electron that then in turn generates charge carriers on its path through a direct converter layer. The charge carriers are transported with the aid of an electric field to an electrode contained in the pixel readout unit and stored there as charge.

In the case of indirect conversion, when impinging on a scintillator layer an x-ray quantum of the x-radiation produces a high energy electron that then in turn generates light on its path through the scintillator layer. The light is converted into electric charge and likewise stored on photodiodes arranged below the scintillator layer and contained in the pixel readout unit.

The corresponding charge pulse, which depends chiefly on the energy of the primary x-ray quantum, is subsequently readout by the active switching elements likewise contained in the pixel readout units. Such solid state detectors are known, for example, from the article entitled "Flachbildde-tektoren in der Röntgendiagnostik" ["Flat image detectors in x-ray diagnostics"] by M. Spahn, V. Heer, R. Freytag, published in the journal Radiologe 43, 2004, pages 340 to 350.

A distinction is made between a counting and an integrating x-ray detector. In a counting x-ray detector, a charge pulse is evaluated in a pixel readout unit as signal of an x-ray quantum, whereas in an integrating x-ray detector integration is carried out over all the charge pulses in a pixel readout unit.

In order to be able to distinguish background noise from a charge pulse originating from an x-ray quantum actually present in the case of a counting x-ray detector, a lower threshold value is defined in general above which a charge pulse is interpreted as a signal of an x-ray quantum. It is also possible to define an upper threshold value above which a charge pulse is defined as a signal of two or more x-ray quanta. In some counting x-ray detectors, the signal level of the charge pulse is recorded in order to be able as well to reduce the quantum energy of the respective x-ray quantum, since signal level and quantum energy are usually proportional to one another.

Counting x-ray detectors are disclosed, for example, in DE 10212638 A1 and DE 10357187 A1. The advantage of counting detectors is that it is possible to reduce the noise, while the signal-to-noise ratio can be improved.

SUMMARY

In at least one embodiment of the present invention, the field, in which counting x-ray detectors can be used and applied, is extended.

As a result of at least one embodiment of the inventive method for recording a digital x-ray image by counting charge pulses and/or x-ray quanta, and of at least one embodiment of the inventive x-ray detector, an additional coordinate that can be used to generate and evaluate the x-ray image is made available by way of the assignment of an item of temporal information, in particular the respective counting instant, relating to the charge pulses and/or to the x-ray quanta as they are being counted. This additional coordinate, which is a time coordinate, opens up a large number of additional or expanded possibilities for using the solid state detector, and offers the following advantages and simplifications, inter alia:

Correlations with detector-external time information can be compiled more easily and used for a more precise and improved diagnostic evaluation of the image data. It is possible in this connection to make use of the time information to extract as many partial x-ray images as desired from a single x-ray image recorded over a lengthy time period. These partial x-ray images then represent x-ray images of a specific time interval, and can be used diagnostically individually or in their sequence. Thus, for example, information relating to an ECG of a patient can be correlated with respective partial x-ray images.

Variations in, for example, the recorded examination object owing to movement or variations in the x-ray source by virtue of the movement thereof (for example in a case of C-arc rotation), or fluctuating energies of the x-ray source can easily be traced back and without time consuming intermediate readout. In addition to time delays, temporal gaps in the sequence of x-ray images, which can result from intermediate readouts of x-ray images are also avoided. Likewise, the prompt recording of x-ray images minimizes movement artifacts on the x-ray images. It is also possible to carry out an improved correction of movement artifacts when the x-ray image is, for example, split up into individual partial x-ray images, corrected for a movement and then recombined.

According to one refinement of at least one embodiment of the invention, the item of temporal information is formed by a time interval in which the counting instant of the respective charge pulse and/or the respective x-ray quantum can be arranged. It is possible in this way to reduce the quantity of data arising from the storage of temporal information. According to a further refinement of at least one embodiment of the invention, a first counting instant is defined with the beginning of the recording of the x-ray image. In this way, the method according to at least one embodiment of the invention can be simplified.

The temporal information is expediently readout from the pixel readout units in common with the spatial information.

In order to be able to draw conclusion on the energy of the charge pulses or the x-ray quanta, and thus to open up further fields of application, the energy of the charge pulses and/or of the x-ray quanta is advantageously measured as they are being counted. According to a further refinement of at least one embodiment of the invention, the energy of the charge pulses and/or of the x-ray quanta is measured as they are being counted and arranged in predefined energy intervals.

BRIEF DESCRIPTION OF THE DRAWINGS

The invention and a further advantageous refinement is explained in more detail below in the drawing with the aid of schematically illustrated example embodiments, without the invention thereby being restricted to these example embodiments; in the drawings.

DETAILED DESCRIPTION OF THE EXAMPLE EMBODIMENTS

Figure 1:
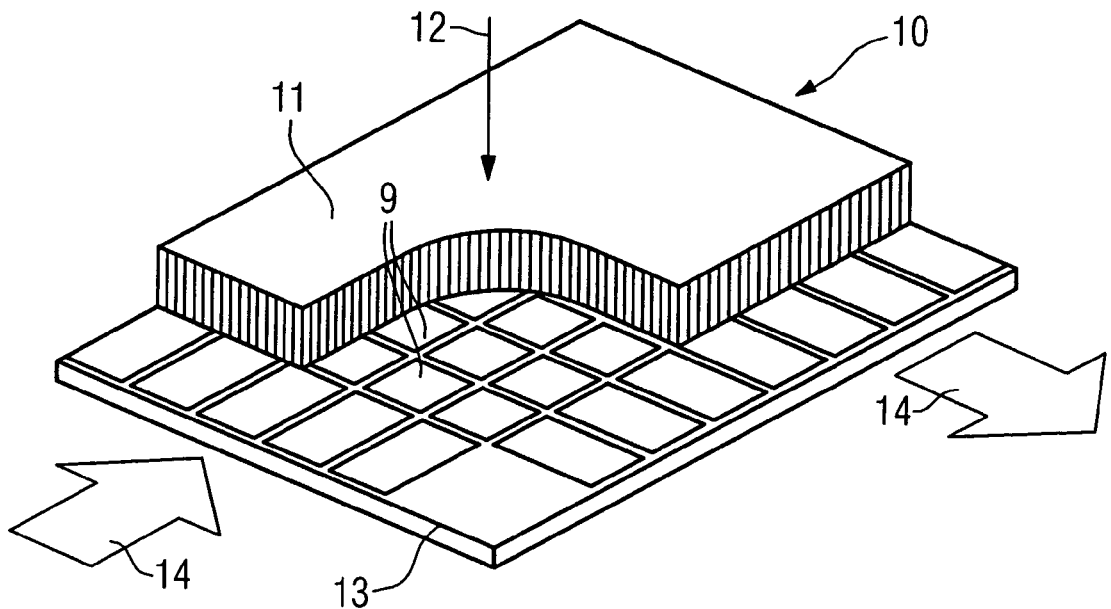
FIG. 1 shows a perspective plan view of a solid state detector according to the prior art.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

Referencing the drawings, wherein like reference numerals designate identical or corresponding parts throughout the several views, example embodiments of the present patent application are hereafter described.

FIG. 1 shows a perspective plan view of a generally known, indirectly converting solid state detector 10. The solid state detector 10 has a scintillator layer 11, as a rule cesium iodide, the scintillator layer 11 being applied to an active readout matrix 13. The active readout matrix 13, which can include one or more a-Si plates, for example, is split up into a multiplicity of pixels that are arranged like a chessboard and of which each is formed from a pixel readout unit 9. In the indirectly converting case illustrated, each pixel readout unit 9 respectively has a photodiode that converts the light generated by the x-ray quanta of the x-radiation 12 into electric charge, and stores it.

Known counting x-ray detectors generally have an x-ray converter layer and an active matrix with pixel readout units based on integrated circuits of CMOS design. In the case of a counting x-ray detector, either each incoming charge pulse is taken as a signal of an x-ray quantum and the counter of the pixel readout unit is incremented by one unit or, and this corresponds to a more precise mode of procedure, the incoming charge pulses are compared with threshold values, then taken as signals of one or more x-ray quanta, and counted by incrementing corresponding counters by one or more units.

Subsequently, the values of the count are read out together with an item of spatial information relating to the position of the respective pixel readout units with the aid of an electronic drive and readout system. In this way, the reading out of the multiplicity of pixels applied like a chessboard produces an electronic x-ray image with a matrix composed of items of image information that can be processed further.

Temporal information is now additionally provided and stored by way of at least one embodiment of the inventive method.

Figure 2:
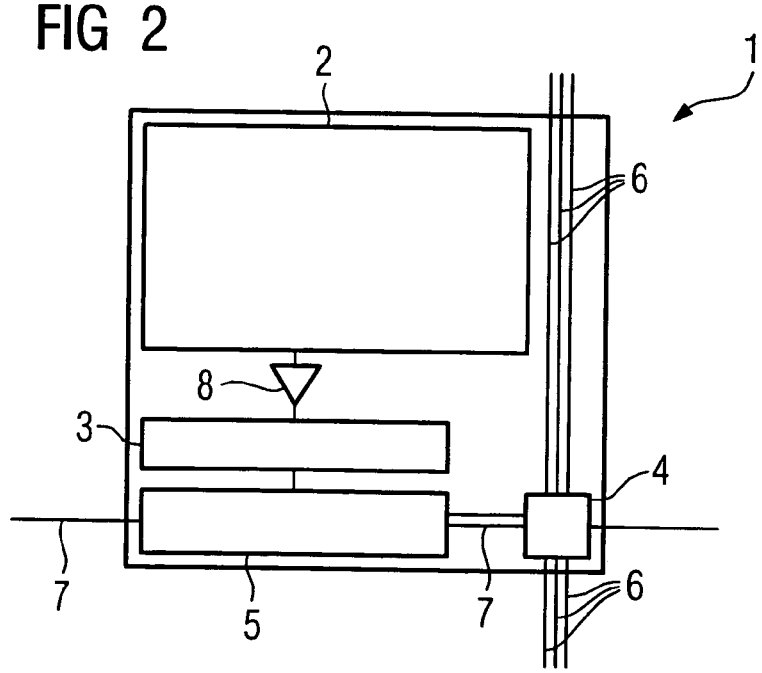
FIG. 2 shows a plan view of a pixel readout unit for use in the case of at least one embodiment of an inventive method.

FIG. 2 shows a plan view of an embodiment of an inventive pixel readout unit 1 that is provided in an embodiment of an inventive x-ray detector. An embodiment of the inventive pixel readout unit 1 has an electrode 2, an energy discriminator 3, a memorizing counter element 5, a readout logic unit 4, data lines 6, drive lines 7 and a pre-amplifier 8.

An example aim of the design of the memorizing counter element 5 is that in addition to an item of information relating to the number of the charge pulses and/or the x-ray quanta the element also stores the respective counting instant. The electrode 2 can also be designed as a photodiode in conjunction with indirect conversion. An embodiment of the inventive pixel readout unit 1 is driven via one or more drive lines 7, and information is passed on via one or more data lines 6, for example during the readout process.

If an x-ray quantum strikes the electrode 2 designed as direct converter, this results in the generation of a charge pulse, which is present in analog form in the electrode 2. The charge pulse is amplified in the pre-amplifier 8. Subsequently, the energy discriminator 3 establishes by comparing the analog charge pulse with threshold values whether the charge pulse lies, for example, within a fixed threshold value interval. It can thereby be assessed whether the charge pulse is noise (below a first threshold value) or whether it is a charge pulse originating from more than one x-ray quantum (above a second threshold value). The threshold values refer in this case to the quantum energy or a variable proportional thereto.

If the charge pulse lies, for example, within the fixed threshold value interval, it is taken as an x-ray quantum and counted together with the information relating to its counting instant, and stored. To this end, an entry with an item of time information is recorded in the memorizing counter element 5, which is advantageously assigned to the energy discriminator 3. The transition to a digital signal is therefore performed while the charge pulse is still present in analog fashion as far as into the energy discriminator 3.

In order to be capable of being recorded for further x-ray quanta, the charge of the first charge pulse is discharged after the discrimination step in the electrode 2. Upon conclusion of the recording process of the x-ray image, the counted x-ray quanta and their associated items of temporal information are read out with the aid of the readout logic unit 4 and the corresponding electronic readout system by the data lines 6, and passed onto an image processing system for correction, evaluation and further processing. The image processing system can be arranged either inside or outside the x-ray detector.

In addition to or instead of the counting instant, it can also be provided to store the instant of impingement of the x-ray quantum on the converter layer as temporal information. In the case of simpler counting x-ray detectors for which threshold values are not considered, counting is undertaken per charge pulse, and the corresponding temporal information of the charge pulse is stored in this case.

According to one refinement of an embodiment of the invention, in order to reduce the quantity of data arising the temporal information that is assigned to the charge pulses and/or x-ray quanta is formed from a time interval in which the counting instant of the respective charge pulse and/or x-ray quantum can be arranged. The memorizing counter element 5 here records only the time interval in which the charge pulse or the x-ray quantum can be arranged, but no longer makes a temporal distinction within this interval. A preselection relating to the maximum number of partial x-ray images that can be extracted later is thereby already fixed.

A first counting instant is advantageously defined at the beginning of the recording of the x-ray image. In this way, there is no need to record the entire absolute instant, but only an instant relative to a beginning of the recording of the respective x-ray image, set as t=0, for example, is stored, and this leads to a further reduction in the quantity of data and thus to a simplification.

According to a further refinement of an embodiment of the invention, the temporal information is read out from the pixel readout units 1 in common with the spatial information. As a result of this, for example, the grey-value information of an x-ray image is obtained in the form of information relating to the respective pixel position and the associated temporal information.

In addition to the temporal information, it is possible to provide in addition that each x-ray quantum or charge pulse is additionally assigned while being counted an item of information relating to its quantum energy. In this connection, the memorizing counter element 5 is used to store the quantum energy or a variable proportional thereto; for example, the number of the charge carriers that have been generated by the corresponding x-ray quantum is proportion to the quantum energy. The storage of the quantum energy is likewise carried out during counting in the memorizing counter element 5. The field of application of the x-ray detector is extended by the storage both of the counting instant and of the energy of the charge pulse or x-ray quantum.

A discrimination method employing a number of discriminators of different threshold elevations and having different memorizing counter elements 5 can be provided in order to limit the quantity of data arising during the storage or acquisition of the quantum energy. For example, it is possible here in the case of an x-ray application with a maximum acceleration voltage of 150 keV for the x-ray quanta to provide that the charge pulses or x-ray quanta are divided into energy intervals from 40 keV to 60 keV, from 60 keV to 80 keV, from 80 keV to 100 keV and from 100 keV to 150 keV.

Figure 3:
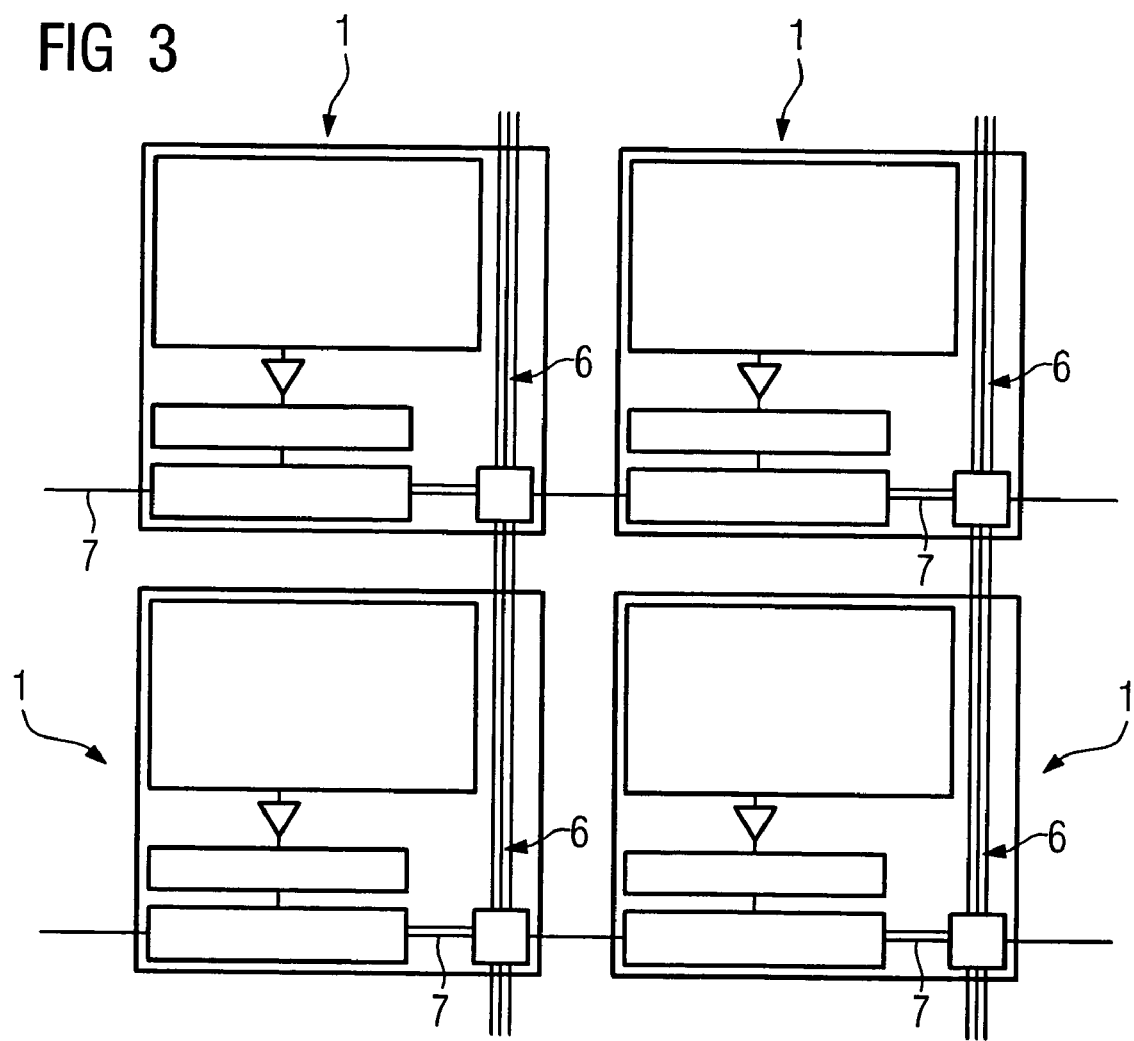
FIG. 3 shows a plan view of an arrangement of a number of pixel readout units in accordance with FIG. 2 in at least one embodiment of an inventive x-ray detector.

FIG. 3 shows a number of pixel readout units 1 that are arranged next to one another in matrix fashion, and whose data lines 6 are connected in the direction of the first pixel axis, that is to say vertically, for example, and whose drive lines 7 are connected perpendicular thereto, that is to say horizontally, for example. An embodiment of an inventive x-ray detector is constructed from a multiplicity of, for example 2000 times 2000, such pixel readout units 1. Such an x-ray detector can be, for example, a mobile flat image detector.

Figure 4:
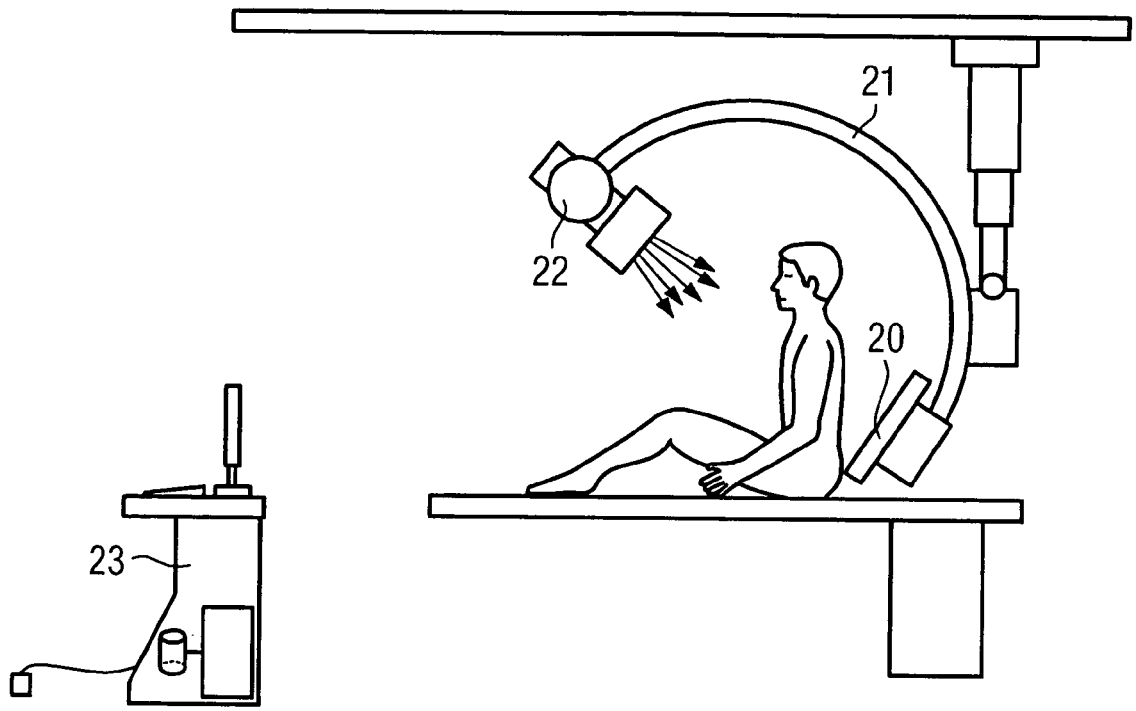
FIG. 4 shows a side view of an inventive x-ray system for 3D recordings having a C-arc with at least one embodiment of an inventive x-ray detector.
Figure 5:
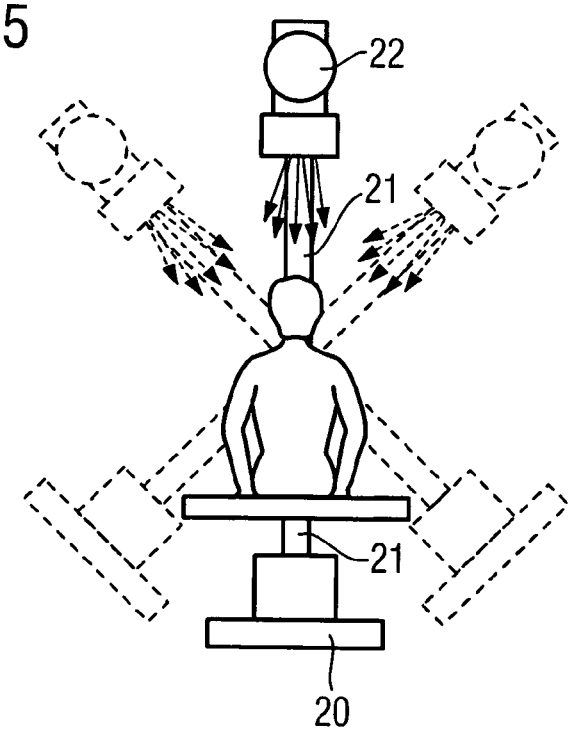
FIG. 5 shows a plan view of a C-arc in accordance with FIG. 4 for 3D recordings in three different positions.

FIG. 4 and FIG. 5 show examples of an application of an inventive x-ray detector 20 in an x-ray system that has a C-arc 21 and is chiefly suitable for 3D recordings. Shown in FIG. 4 is a ceiling-mounted C-arc 21 at one end of which an x-ray source 22 is mounted, and at whose opposite end the x-ray detector 20, for example a flat image detector, is arranged. The C-arc, the x-ray source 22 and x-ray detector 20 are controlled by a control device 23. Also located in the control device is a system for image processing and displaying x-ray images.

In order to record 3D x-ray images, the C-arc 21 can be tilted into a number of different positions—as shown in FIG. 5. By recording a number of x-ray images of the same examination object in a number of tilted positions, it is possible to use similar x-ray systems from the prior art to extract three-dimensional displays. Such an embodiment of an inventive x-ray system, in which an item of temporal information has been assigned to the charge pulses and/or the x-ray quanta as they are being counted, is used, for example, to record only one x-ray image from which partial x-ray images can easily be extracted, or temporal variations in the examination object can be reconstructed.

An embodiment of an inventive x-ray detector or an embodiment of an inventive method can be used, for example, in further x-ray systems such as, for example, in a computed tomography x-ray system.

An embodiment of the invention can be summarized briefly in the following way: a method for recording a digital x-ray image, and a counting x-ray detector 20 are provided for the purpose of extending the field of application of counting x-ray detectors, the counting x-ray detector 20 with pixel readout units 1 arranged in a matrix being used to detect and count x-ray quanta and/or charge pulses generated by x-ray quanta, and an item of temporal information being assigned to the charge pulses and/or the x-ray quanta as they are being counted.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for recording a digital x-ray image, comprising:

using a counting x-ray detector, with pixel readout units arranged in a matrix, to detect and count at least one of x-ray quanta of an x-radiation and charge pulses generated by the x-ray quanta, the at least one of charge pulses and x-ray quanta assigned an item of temporal information while counted, wherein the pixel readout units include at least one discriminator with a threshold value, the pixel readout units include memorizing counter elements for counting the at least one of charge pulses and x-ray quanta and for storing the temporal information, and each discriminator is assigned a memorizing counter element.

2. The method as claimed in claim 1, wherein the item of temporal information includes a counting instant of the at least one of charge pulses and x-ray quanta.

3. The method as claimed in claim 2, wherein a first counting instant is defined with a beginning of a recording of an x-ray image.

4. The method as claimed in claim 1, wherein the item of temporal information is formed by a time interval in which a counting instant of the at least one of charge pulses and x-ray quanta is arrangeable.

5. The method as claimed in claim 4, wherein a first counting instant is defined with a beginning of a recording of an x-ray image.

6. The method as claimed in claim 1, wherein the temporal information is readout from the pixel readout units in common with a spatial information.

7. The method as claimed in claim 1, wherein an energy of the at least one of charge pulses and x-ray quanta is measured while counted.

8. The method as claimed in claim 7, wherein the energy of the at least one of charge pulses and x-ray quanta is measured while counted and arranged in prescribed energy intervals.

9. The method as claimed in claim 1, wherein the at least one discriminator is designed to increment the associated memorizing counter element by one unit when a quantum energy of the at least one of charge pulses and x-ray quanta exceeds the threshold value of the discriminator.

10. A counting x-ray detector for recording a digital x-ray image from an x-radiation, comprising:
    pixel readout units, arranged in a matrix, to detect and to count at least one of x-ray quanta of an x-radiation and charge pulses generated by the x-ray quanta, wherein
    an item of temporal information is assignable to the at least one of charge pulses and x-ray quanta while counted, wherein
    the pixel readout units include at least one discriminator with a threshold value,
    the pixel readout units include memorizing counter elements for counting the at least one of charge pulses and x-ray quanta and for storing the temporal information, and
    each discriminator is assigned a memorizing counter element.

11. The x-ray detector as claimed in claim 10, wherein the item of temporal information includes a counting instant of the at least one of charge pulses and x-ray quanta.

12. The x-ray detector as claimed in claim 10, wherein the item of temporal information is formed by a time interval in which a counting instant of the at least one of charge pulses and x-ray quanta is arrangeable.

13. The x-ray detector as claimed in claim 10, wherein a first counting instant is defined with a beginning of a recording of an x-ray image.

14. The x-ray detector as claimed in claim 10, wherein the at least one discriminator is designed to increment the associated memorizing counter element by one unit when a quantum energy of the at least one of charge pulses and x-ray quanta exceeds the threshold value of the discriminator.

15. The x-ray detector as claimed in claim 10, wherein the x-ray detector is designed as a flat image detector.

16. An x-ray system comprising an x-ray detector as claimed in claim 10.

17. The x-ray system as claimed in claim 16, further comprising an x-ray source, with the x-ray detector and the x-ray source fastened on a tiltable C-arc.

* * * * *